United States Patent
Heinz et al.

(10) Patent No.: US 6,172,445 B1
(45) Date of Patent: *Jan. 9, 2001

(54) PIEZOELECTRIC ACTUATOR

(75) Inventors: Rudolf Heinz, Renningen; Dieter Kienzler, Leonberg; Roger Potschin, Brackenheim; Klaus-Peter Schmoll, Lehrensteinsfeld; Friedrich Boecking, Stuttgart, all of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/117,891
(22) PCT Filed: Oct. 9, 1997
(86) PCT No.: PCT/DE97/02306
 § 371 Date: Feb. 5, 1999
 § 102(e) Date: Feb. 5, 1999
(87) PCT Pub. No.: WO98/25060
 PCT Pub. Date: Jun. 11, 1998

(30) Foreign Application Priority Data
Dec. 7, 1996 (DE) .............................. 196 50 900

(51) Int. Cl.⁷ ...................................... H01L 41/08
(52) U.S. Cl. .............................................. 310/328
(58) Field of Search ................... 310/328, 366, 310/344

(56) References Cited

U.S. PATENT DOCUMENTS

| | | | | |
|---|---|---|---|---|
| 3,903,435 | * | 9/1975 | Bouygues et al. | 310/328 |
| 4,553,059 | * | 11/1985 | Abe et al. | 310/328 |
| 4,958,101 | * | 9/1990 | Takahashi et al. | 310/328 |
| 5,004,945 | * | 4/1991 | Tomita et al. | 310/328 |
| 5,113,108 | * | 5/1992 | Yamashita et al. | 310/328 |
| 5,250,868 | * | 10/1993 | Shirasu | 310/328 |
| 5,289,074 | * | 2/1994 | Mori | 310/328 |
| 5,334,902 | * | 8/1994 | Inoi | 310/344 |
| 5,477,102 | * | 12/1995 | Miyoshi | 310/344 |
| 5,907,211 | * | 5/1999 | Hall et al. | 310/328 |

* cited by examiner

Primary Examiner—Mark O. Budd
(74) Attorney, Agent, or Firm—Ronald E. Greigg; Edwin E. Greigg

(57) ABSTRACT

A piezoelectric actuator intended for instance for actuating injection valves in internal combustion engines of motor vehicles is protected against destructive tensile strains in that resilient prestressing elements that subject the piezoelectric body to precompression are provided for the piezoelectric body of the actuator.

9 Claims, 5 Drawing Sheets

PIEZOELECTRIC ACTUATOR

PRIOR ART

The invention is based on a piezoelectric actuator, having a piezoelectric body, in particular in the form of a multilayer laminate with layers of piezoelectric or piezoceramic material layered on one another and intervening metal or electrically conductive layers acting as electrodes, in which the body, upon pulsating electrical action on its electrodes, executes analogously pulsating strokes, changing the distance between two face ends, facing away from one another, of the body.

Piezoelectric actuators are widely known and in the case of motor vehicles may be used for instance for injection valves of the engine and in brake systems that have antilocking (ABS) and traction controls (ASR). Such injection valves have an injection nozzle controlled by a tappetlike closure device. An operative surface on the nozzle side is disposed on the tappet and acted upon by the pressure of the fuel supplied to the nozzle; the pressure forces seek to force the tappet in the opening direction of the closure device. The tappet, with a plungerlike end whose cross section is larger than the aforementioned operative surface, protrudes into a control chamber. The pressure prevailing there seeks to urge the tappet in the closing direction of the closure device. The control chamber communicates with the fuel delivery, which is at high pressure, via an inlet throttle and with a fuel return line that has only slight pressure via what as a rule is a throttled outlet valve, or an outlet valve combined with an outlet throttle. When the outlet valve is closed, a high pressure prevails in the control chamber, by which the tappet is moved in the closing direction of the closure device or is held in the closing position, counter to the pressure at its operative surface toward the nozzle. When the outlet valve opens, the pressure in the control chamber drops; the magnitude of the pressure drop is determined by the size of the inlet throttle and the magnitude of the throttle resistance of the opened outlet valve, or the outlet throttle combined with it. The outcome is that the pressure in the control chamber decreases when the outlet valve is opened, such that the tappet is moved in the opening direction of the closure device, or is retained in the opening position, by the pressure forces operative at its operative face toward the nozzle.

The aforementioned outlet valve can be actuated by means of a piezoelectric actuator; in comparison with the reciprocating motion of the closure device of the injection nozzle, short strokes suffice.

ADVANTAGES OF THE INVENTION

Piezoelectric actuators have proven to be reliable adjusting and drive devices. However, when the piezoelectric actuators are used or disposed care must be taken that the piezoelectric bodies which are embodied as multilayer laminates by multilayer technology must not be loaded by tensile stress, or can be so loaded only slightly. This can make the construction of piezoelectrically actuated assemblies more difficult.

According to the invention, the piezoelectric actuators are also suitable for loads in the tensile direction, because it is provided that the piezoelectric body has an elastic chucking means that braces the end faces against one another, with precompression of the piezoelectric body.

The invention is based on the general concept of elastically precompressing the piezoelectric body of the actuator by means of prestressing elements disposed or retained on it, counter to the direction of the desired tensile stress, and thus of loading them constantly with pressure; upon imposition of pulsating or alternating electrical fields, the piezoelectric body forces the aforementioned face ends apart, thereby exerting pressure on the piezoelectric material and elastically stretching the chucking means, and then these face ends are subsequently urged toward one another, utilizing the energy elastically stored in the chucking means, thereby exerting pressure on the piezoelectric body, and work that is operative toward the outside can then be accomplished in both directions of motion.

In the invention, the fact that the face ends, which vary their spacing during work strokes of the piezoelectric body, are meant to be covered with stable coupling elements or end plates in order to transmit force to abutments or to elements that are to be driven, which coupling elements or end plates can be structurally simply connected by elastic tensioning elements, can advantageously be exploited in order to constant assure the desired impingement of pressure on the piezoelectric body.

In a first embodiment of the invention, the tensioning elements may be embodied as one or more resilient clips, which seek to force the aforementioned coupling elements or end plates toward one another, exerting pressure on the piezoelectric body.

Instead of this, it is also possible to connect the coupling elements or end plates to one another by means of resiliently embodied tensioning bands.

The tensioning bands may comprise round or flat material. Finally, the possibility exists of connecting the coupling elements or end plates to one another via a tubular bellows embodied in the manner of a tension spring, so that the chucking means of the piezoelectric body also forms a housing that protects the piezoelectric body.

The tensioning elements are preferably embodied with only slight stiffness, such that their tensioning forces vary only relatively little upon pulsating motions of the piezoelectric body; in particular, the magnitude of the change in force should be slight in comparison with the operative force.

BRIEF DESCRIPTION OF THE DRAWINGS

In addition, with regard to preferred characteristics of the invention, reference will be made to the ensuing description of the drawings, in terms of which the especially advantageous characteristics and embodiments are described.

DESCRIPTION OF THE EXEMPLARY EMBODIMENTS

Figure 1:
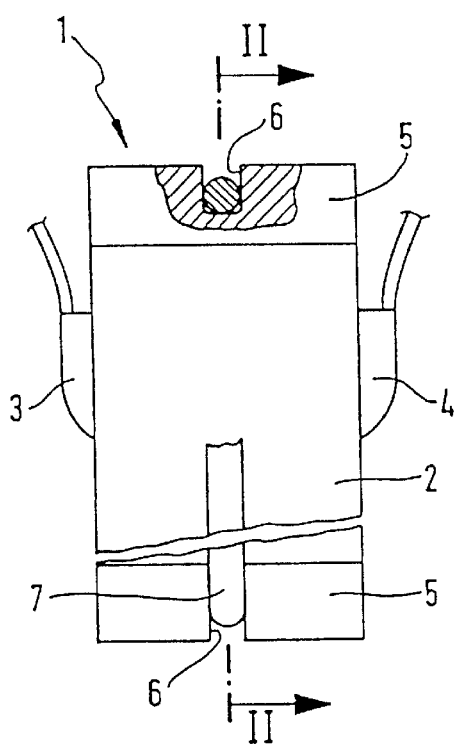
FIG. 1 is a view partly in section of a first embodiment of an actuator according to the invention.
Figure 2:
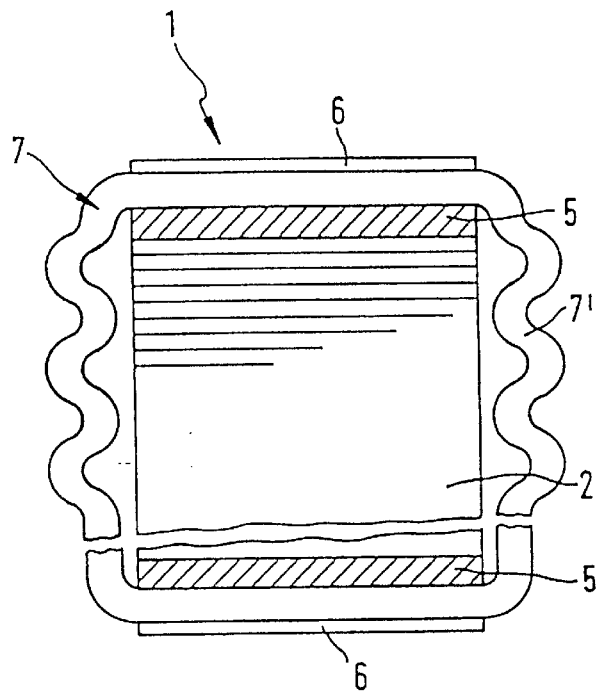
FIG. 2 is a sectional view taken along the line II—II of FIG. 1.

In FIGS. 1 and 2, a piezoelectric actuator 1 has a piezoelectric body 2, which by way of example may comprise many layers of piezoceramic material, between each of the layers electrically conductive layers are disposed that are electrically conductively connected in alternation with an electrical terminal 3 or an electrical terminal 4, so that when the terminals 3 and 4 are connected to a pulsating electrical voltage source or alternating voltage source, not shown, the piezoelectric body 2 is excited in a known manner to execute pulsating motions, in which the distance or spacing between the upper and lower face ends, in terms of FIG. 1, of the piezoelectric body 2 varies.

The aforementioned face ends are covered by stable plates 5, which in the example of FIGS. 1 and 2 are provided with a central face-end groove 6. The groove 6 of the upper plate 5, in terms of FIGS. 1 and 2, is disposed parallel to the groove 6 in the lower plate 5. The grooves 6 serve to receive and retain a spring clip 7, embodied as a closed ring, which in framelike fashion encloses both the piezoelectric body 2 and the plates 5 and is received with transverse regions in the groove 6. The spring clip 7 has elastic portions 71, extending laterally of the piezoelectric body 2, which are prestressed in tensile fashion and accordingly place the piezoelectric body 2 between the plates 5 under precompression. To attain a spring stiffness to be predetermined, the portions 7' have one or more crescents or an undulating form, and the tensile forces operative between the plates 5 seek to bend the crescents or undulations open.

Figure 3:
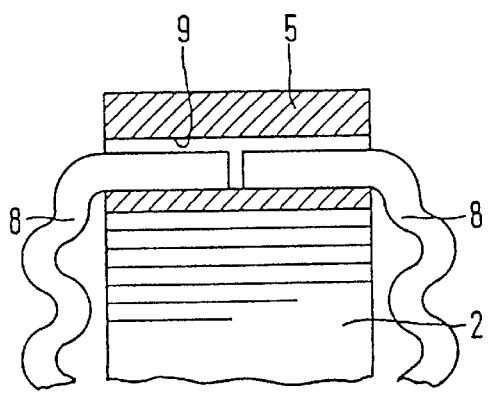
FIG. 3 is a sectional view, corresponding to FIG. 2, of a modified embodiment.

The embodiment of FIG. 3 differs from the above-described embodiment, among other ways, in that on the piezoelectric body 2 two spring clips 8 separate from one another are provided, and that a bore 9 is provided in each of face-end plates 5 on the piezoelectric body 2, into which bores the respective spring clips 8 are inserted with ends bent at an angle.

Figure 4:
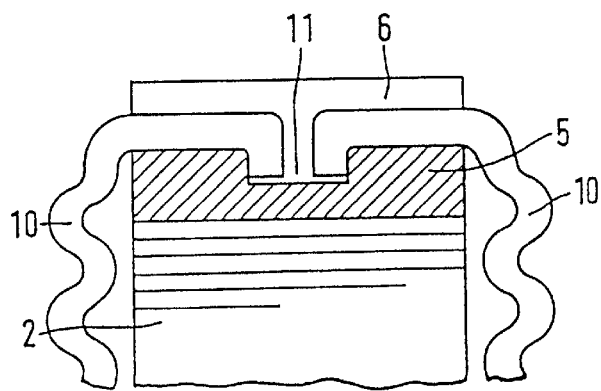
FIG. 4 is a sectional view of a further modified embodiment.

The embodiment of FIG. 4 differs from the embodiment of FIGS. 1 and 2 again in that two spring clips 10 are provided.

These spring clips 10 again have end regions received in the grooves 6 of plates 5, but these end regions are embodied in hooklike fashion; the hooklike ends each engage one indentation 11 formed inside the grooves 6.

In all the embodiments described above, the spring clips 7, 8 and 10 may comprise a spring steel wire of circular cross section.

In principle, however, other cross sections and other spring materials are also conceivable.

If two separate clips 8 or 10 are disposed and insulated electrically from one another, then these clips can also be disposed as electrical terminals and electrically connected to corresponding contact faces of the piezoelectric body 2 by press-fitting, soldered connections, or the like.

Figure 5:
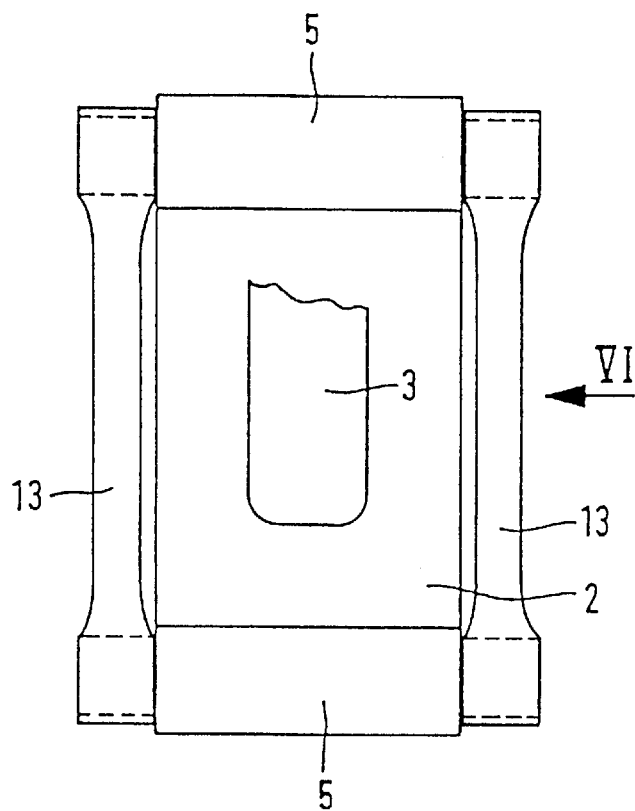
FIG. 5 is a view of an embodiment in which resilient tensioning bands are disposed between plates disposed on the face ends of the actuator.
Figure 6:
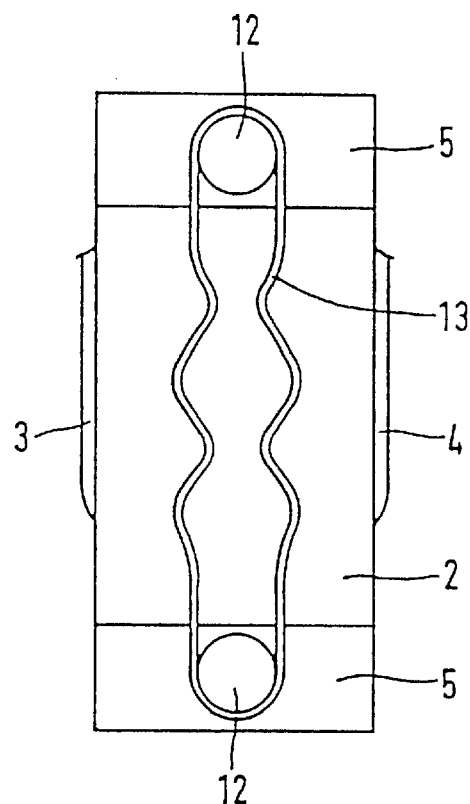
FIG. 6 is an elevation view in the direction of the arrow VII of FIG. 5.

In the embodiment shown in FIGS. 5 and 6, lateral projections 12 which serve to retain resilient tensioning bands 13 are provided on each of the face-end plates 5.

These bands may be embodied as in FIG. 6 in the manner of a loop wrapped around the projections 12 of the plates 5 and may have an undulating form in the region between the projections 12; the tensioning forces operative between the projections 12 seek to bend the aforementioned undulations open. In the region of the projections 12, the tensioning bands 13 may have a comparatively great width, while the undulating regions of the tensioning bands 13 are narrower.

As a result of the tensile forces of the tensioning bands 13 that are operative between the projections 12, the piezoelectric body 12 is again subject to a constantly operative precompression.

Figure 7:
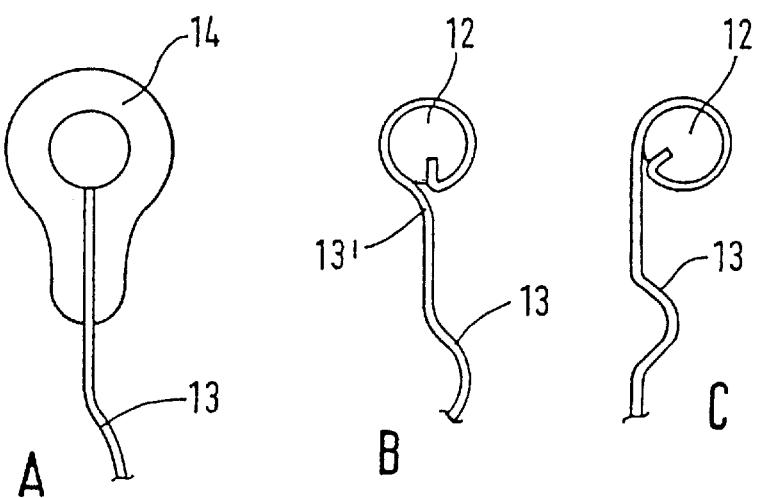
FIG. 7 shows various variants for resilient tensioning bands.

FIG. 7 shows modified embodiments of the tensioning bands 13. In diagram A, each tensioning band 13 may be provided on its ends with an eyelet 14, which can be slipped onto each of the projections 12. In diagrams B and C, the projections 12 can each have an axial slit that receives a respective end of an end region, wrapped around the respective projection 12, of a tensioning band 13.

In the example of diagram B, the tensioning band 13 has an S-shaped region 13', in the region of the projection 12, that is resilient because of its shape; that is, major tensile forces seek to pull this region 13' smooth.

Figure 8:
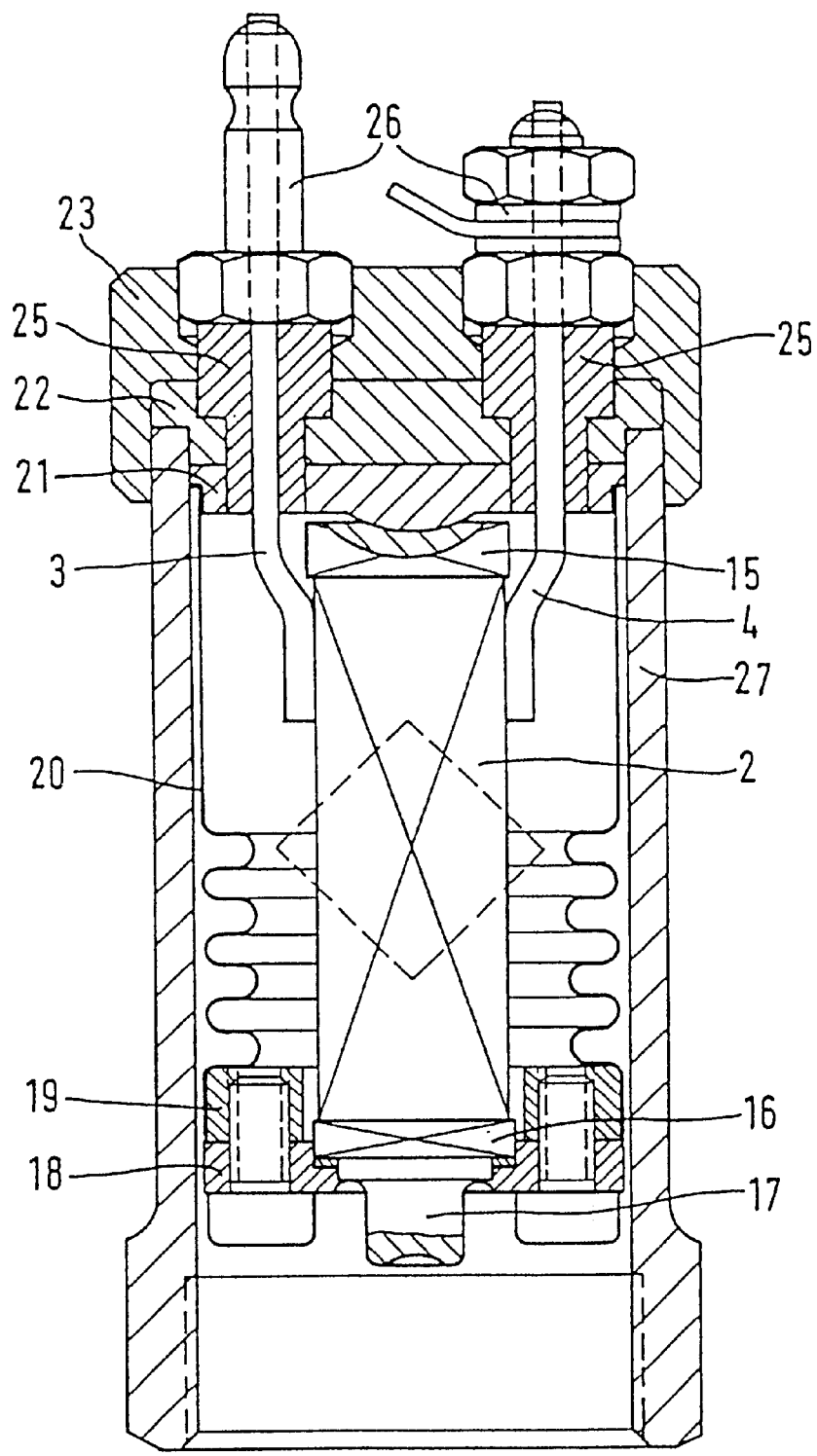
FIG. 8 is a sectional view of an embodiment in which a spring sleeve is disposed between face-end plates of the actuator.

In the embodiment of FIG. 8, the piezoelectric body 2 is provided, on one face end, with a face-end concave plate 15 and, on its other end, with a plate 16, which on its side remote from the body 2 has a tappetlike extension 17. The edge of the plate 16 is received by an annular flange 18, which is connected to an annular bottom 19 of a spring sleeve 20 whose other end is retained on a bottom 21, which with an inner convexity engages the concavity on the side facing it of the plate 15. The spring sleeve is subject to relatively major tensile stress, such that the bottoms 19 and 21 subject the piezoelectric body 2 to a corresponding precompression.

In its upper region in terms of FIG. 8, the spring sleeve 20 has a substantially cylindrical shape, while its lower region undulates in bellowslike fashion; the undulations preferably each form semicircular arcs, as shown in FIG. 8.

The wall thickness of the sleeve, which is preferably of spring steel, may range between 0.1 and 0.6 mm and is preferably approximately 0.3 mm.

The maximum tensile stress in the undulating region should not exceed 800 to 900 N/mm². Because of the multiple undulations, the total tensile stress of the spring sleeve 20 can be approximately 500 to 1500 N. If the cross section of the piezoelectric body is on the order of 1 cm², the resultant precompression is then approximately 500 to 2000 N/cm².

A support plate 22 is disposed on the bottom 21 and is received in turn in a cup-shaped cap 23. The bottom 21, the support plate 22, and the cap 23 have openings aligned with one another, through which the terminals 3 and 4 are passed; pluglike closure elements 25 are disposed in the aforementioned openings and may optionally be embodied by casting material. The closure elements 25 have terminal contacts 26, by way of which the piezoelectric body 2 can be subjected to an electrical voltage.

The cap 23 is connected to a cylinder 27, which sheaths the spring sleeve 20 with radial spacing and whose lower end is provided with a female thread, so that the cylinder can be screwed onto the housing of an injection valve in a manner to be described hereinafter.

Figure 9:
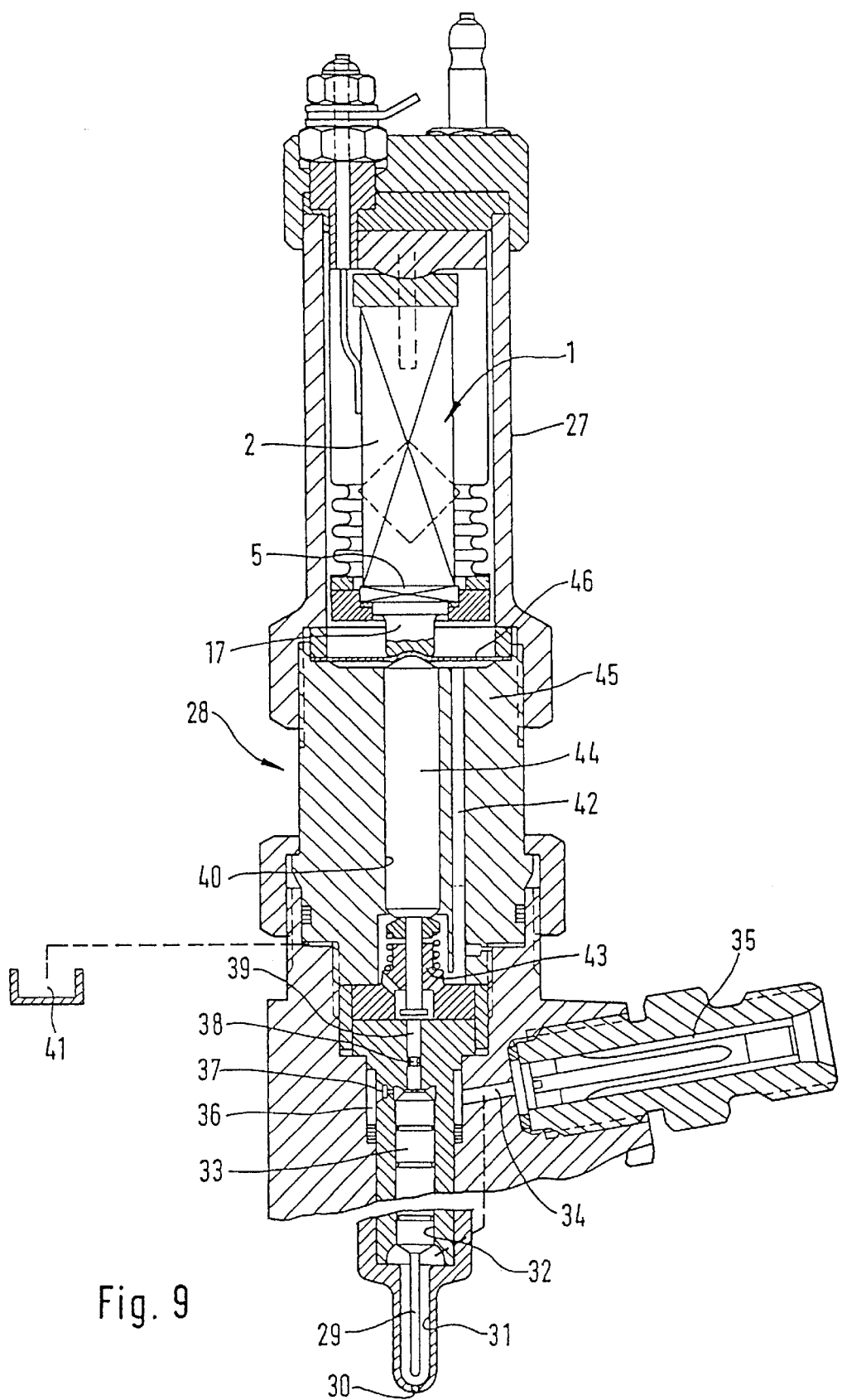
FIG. 9 is an overview of an injection valve.

In FIG. 9, an injection nozzle 30 controlled by a needle 29 is disposed on a multipart housing 28 of the injection valve assembly shown; fuel at relatively high pressure can be delivered to the injection nozzle via a housing bore 31 that receives the needle 29. The housing bore 31 widens toward the top to form a cylindrical work chamber 32 for a plungerlike tappet 33, firmly connected to the needle 29 and received reciprocatingly inside the work chamber 32. The widened end region, the lower region in FIG. 9, of the work chamber 32 communicates, via a housing bore not visible in FIG. 9, with a transverse bore 34, which via a gap filter 35 communicates with a fuel delivery line, not shown. The transverse bore 34 discharges into an annular chamber 36, which via an inlet throttle 37 communicates with what is the upper end region in FIG. 9 of the work chamber 32. In addition, the upper end region of the work chamber 32 is adjoined by a bore 39 that is coaxial with the work chamber 32 and is provided with an outlet throttle 38. The bore 39 discharges into an adjoining coaxial bore 49, which communicates both with a relief chamber 41 and a compensation bore 42 that is disposed parallel to the bore 40 and connects the ends thereof to one another. A control valve 43 is disposed in the bore 40; it controls the orifice toward it of the bore 39 and thus controls the communication of the bore 39 with the relief chamber 41. The control valve 43 is actuated by means of a tappet 44, which is disposed in the bore 40 and is actuated in turn by means of the piezoelectric actuator 1. The actuator 1 is accommodated in the cylinder 27, whose interior may be sealed off from the entry of fuel by a diaphragm 46 that is retained between the adjoining housing part 45 and the cylinder 24.

The arrangement shown functions as follows:

If the actuator 1 is acted upon by an electrical voltage or a pulsating electrical voltage, the piezoelectric body 2 executes pulsating motions, which are transmitted to the tappet 44, causing the tappet to open or close the control valve 43, via the tappetlike extension 17 disposed on the piezoelectric body 2, or on the face-end plate 5 disposed on the piezoelectric body. When the control valve 43 is closed, the pressure of the fuel delivered via the transverse bore 34 acts on both ends of the plungerlike tappet 33. Since the lower end, compared with the upper end, has a cross section reduced by the cross section of the needle 29, the tappet 33 is forced downward by the fuel pressure, so that the needle 29 closes the injection nozzle 30. As soon as the control valve 43 opens, the pressure at the upper end of the tappet 33 drops, the pressure drop being determined by the ratio between the throttle resistances of the input throttle 37 and the outlet throttle 38. As a result, the pressure of the fuel acting on the lower end of the tappet 33 can lift the tappet 33, thereby causing the needle 29 to open the injection nozzle 30.

Figure 10:
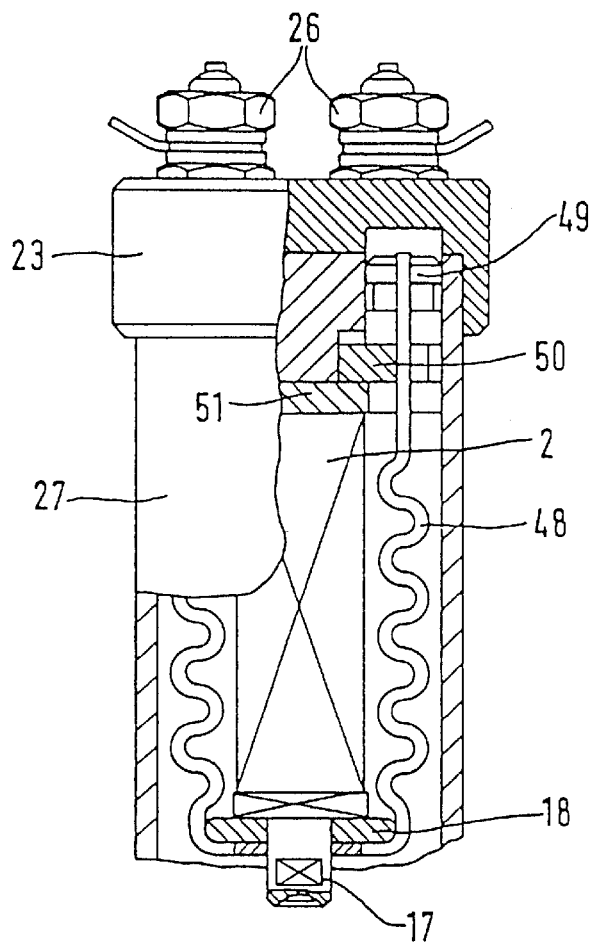
FIG. 10 is a sectional view of a further embodiment of an actuator.

The embodiment shown in FIG. 10 differs from the embodiment of FIG. 8 above all in that instead of the spring sleeve 20 of FIG. 8, an undulating spring band 48 is provided, which is wrapped around the side of the annular flange 18 remote from the piezoelectric body 2 and on that side has an opening for the extension 17 of the plate 16.

The two ends of the spring band 48 are hard-soldered (copper-soldered) each in a respective nipplelike suspender 49, which is supported on a disklike support and compensation element 50 that in turn rests on an end plate 51 of the piezoelectric body 2. Slits that are open toward the side are provided both in the support and compensation element 50 and in the end plate 51, so that the spring band 48 can pass through them.

Figure 11:
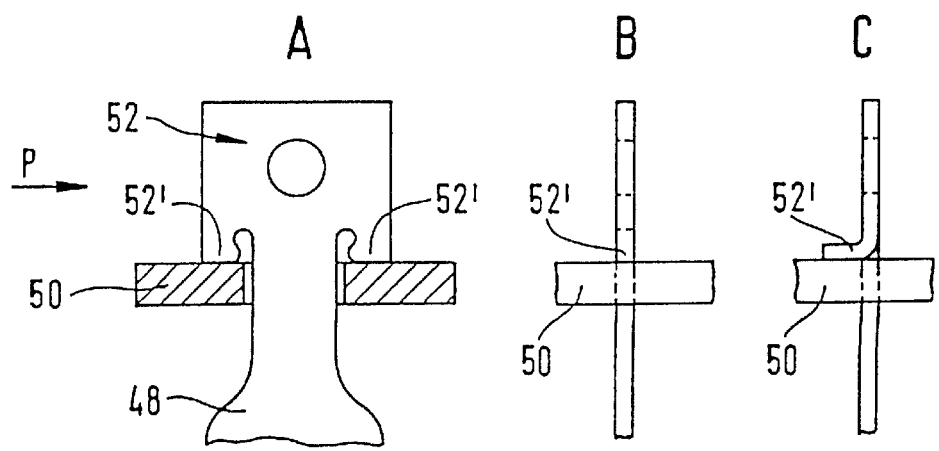
FIG. 11 shows an advantageous variant for retaining a spring band acting as a chucking means for the piezoelectric body.

Instead of the suspenders 49 firmly connected to the spring band 48, armature-like end parts 52 may also be integrally formed onto the spring band 48, as shown in diagram A of FIG. 11. These parts, in the example of FIG. 11, are embodied as essentially square tabs with a central opening for the engagement of a tool. Each end part 52, or the tab forming it, is dimensioned such that the slit through which the spring band 48 passes and which is disposed in the end plate 51 or the associated support and compensation element 50 in the transverse direction of the slit can be spanned by this end part or tab, the end part or tab being supported with corner regions 52' on both sides of the aforementioned slit on a face end of the support and compensation element 50 or of the end plate 51.

The transitions between the corner regions 52' and the—relatively narrow—part of the spring band 48 passing through the slit are embodied as U-shaped or (preferably) keyhole-shaped recess, such that the corner regions 52' form short extensions of the end part 52 oriented toward the facing face end of the support and compensation element 50 or of the end plate 51, and the formation of cracks at the transitions is avoided.

In diagram B, which shows a first variant of a side view of the end part 52 in the direction of the arrow P in diagram A of FIG. 11, the corner regions 52' may be embodied substantially flat and may be disposed at approximately the same level as the rest of the end part 52.

Instead, it is also possible and advantageous, as shown in diagram C of FIG. 11, to bend the ends of the corner regions 52 relative to the plane of the end part 52 in such a way that a bent portion of each corner region 52' rests generally flatly on the associated face end of the support and compensation element 50.

The foregoing relates to a preferred exemplary embodiment of the invention, it being understood that other variants and embodiments thereof are possible within the spirit and scope of the invention, the latter being defined by the appended claims.

What is claimed is:

1. A piezoelectric actuator, suitable for actuating control valves or injection valves in internal combustion engines in motor vehicles, having a piezoelectric body, a form of a multilayer laminate with layers of piezoelectric or piezoceramic material layered on one another and intervening metal or electrically conductive layers acting as electrodes, in which the piezoelectric body, upon pulsating electrical action on its electrodes, executes analogously pulsating strokes, changing a distance between two face ends, facing away from one another, of the piezoelectric body, the piezoelectric body (2) has an elastic chucking means (7, 8, 10, 13) that braces the face ends against one another, with precompression of the piezoelectric body (2), and a spring or tensioning band (48) is wrapped around a face end or a face-end plate (16, 18) of the piezoelectric body (2) and is suspended by suspenders (49), secured to its end, or by integrally formed-on end parts (52), from recesses or slits in a plate (51) disposed on the other face end of the piezoelectric body (2).

2. The actuator of claim 1, in which stable plates (5, 15, 16) are disposed on the face ends of the piezoelectric body (2), and are tensed against one another, with precompression of the piezoelectric body (2), by tensioning elements (7, 8, 10, 134, 20) that are operative between them.

3. A piezoelectric actuator, suitable for actuating control valves or injection valves in internal combustion engines in motor vehicles, comprising a piezoelectric body formed as a multilayer laminate with layers of piezoelectric or piezoceramic material layered on one another and intervening metal or electrically conductive layers which act as electrodes and connected to an electrical terminal in which the piezoelectric body upon pulsating electrical action on the electrodes, executes analogously pulsating strokes, changing a distance between two face ends of the piezoelectric body and facing away from each other, stable plates (5, 15, 16) are disposed on the face ends of the piezoelectric body (2), and the stable plates are tensed against one another by means of at least one spring clip (7, 8, 10), which fits around the piezoelectric body (2) and over the plates, said at least one spring clip is arrested in a respective recess machined into the respective plate which extends parallel to the face of said plates, and regions of said at least one clip which extends laterally of the piezoelectric body have an undulating form.

4. The actuator of claim 3, in which two spring clips (8, 10) separate from one another are provided, each embodied substantially in a C shape and with their ends fitting over the plates (5).

5. The actuator of claim 3, in which the spring clip (7) is embodied as an annularly closed part.

6. A piezoelectric actuator, suitable for actuating control valves or injection valves in internal combustion engines in motor vehicles, comprising a piezoelectric body, formed as a multilayer laminate with layers of piezoelectric or piezoceramic material layered on one another and intervening metal or electrically conductive layers which act as electrodes and connected to an electrical terminal, in which the piezoelectric body, upon pulsating electrical action on the electrodes, executes analogously pulsating strokes, changing a distance between two face ends of the piezoelectric body facing away from one another, stable plates (5, 15, 16) are disposed on the face ends of the piezoelectric body (2), and are provided with laterally formed projections for retaining at least one spring clip (7, 8, 10), which forms a loop wrapped around the projections, and the at least one spring clip or tensioning bands have an undulating form which thereby tenses the plates against the piezoelectric body.

7. The actuator of claim 6, in which the spring or tensioning bands (13) are retained on the projections (12) by means of eyelets (14) disposed on the tensioning bands.

8. The actuator of claim 6, in which the spring or tensioning bands (13) are wrapped with an end region around an associated projection (12), and inserted by the free end into an axial slit embodied on the projection.

9. The actuator of claim 6, in which the spring or tensioning bands (13) form one or more crescents between the projections (12).

* * * * *